US009903486B2

(12) United States Patent
Eckberg et al.

(10) Patent No.: US 9,903,486 B2
(45) Date of Patent: Feb. 27, 2018

(54) CONFIGURABLE MODULAR SLEEVE VALVE

(71) Applicant: International Business Machines Corporation, Armonk, NY (US)

(72) Inventors: Eric A. Eckberg, Rochester, MN (US); Jessica R. Eidem, Rochester, MN (US); James D. Gerken, Zumbro Falls, MN (US); Laurie M. Gerken, Zumbro Falls, MN (US); Glenn S. Leckband, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/275,534

(22) Filed: Sep. 26, 2016

(65) Prior Publication Data

US 2017/0009897 A1   Jan. 12, 2017

Related U.S. Application Data

(62) Division of application No. 14/506,772, filed on Oct. 6, 2014, now Pat. No. 9,493,932.

(51) Int. Cl.
*F16K 11/20* (2006.01)
*F16K 11/085* (2006.01)
(Continued)

(52) U.S. Cl.
CPC ............ *F16K 11/0853* (2013.01); *E03B 7/04* (2013.01); *E03B 7/07* (2013.01); *E03B 7/075* (2013.01);
(Continued)

(58) Field of Classification Search
CPC ........................................................ F16K 27/06
(Continued)

(56) References Cited

U.S. PATENT DOCUMENTS 1,496,584 A * 6/1924 McCrink ................. F16K 11/12
137/555
1,566,605 A * 12/1925 Jamison ................ F16K 11/202
137/555
(Continued)

FOREIGN PATENT DOCUMENTS

CA        1067791 A1   12/1979
CN      202690564 U    1/2013
(Continued)

OTHER PUBLICATIONS

Hughes, "Advantages of Liquid Cooling for HPC", Clustered Systems Company, Inc., 2014. https://www.linkedin.com/groupItem 8 pages.

(Continued)

*Primary Examiner* — John Fox
(74) *Attorney, Agent, or Firm* — Jay Wahlquist

(57) ABSTRACT

A modular sleeve valve apparatus can include a valve body including a first port and a second port on a first and second sidewall of the valve body. The apparatus can include a first and second valve core sleeved within the valve body. The first valve core can be a cylinder including a first aperture in a cylindrical sidewall and a second aperture in a top base-wall. The second valve core can be a cylinder including a third aperture in a cylindrical sidewall and a fourth aperture in a bottom base-wall. The first and second valve cores can be removable from the valve body and radially rotatable within the valve body. The second valve core can be positioned stacked upon the first valve core to align the second aperture and the fourth aperture.

6 Claims, 7 Drawing Sheets

(51) Int. Cl.

| | |
|---|---|
| *E03B 7/07* | (2006.01) |
| *F16K 3/26* | (2006.01) |
| *F16K 37/00* | (2006.01) |
| *F16K 11/02* | (2006.01) |
| *E03B 7/04* | (2006.01) |
| *F16K 5/04* | (2006.01) |
| *H05K 7/20* | (2006.01) |

(52) U.S. Cl.
CPC ............. *F16K 3/26* (2013.01); *F16K 5/0414* (2013.01); *F16K 11/02* (2013.01); *F16K 11/085* (2013.01); *F16K 37/0058* (2013.01); *H05K 7/20* (2013.01)

(58) Field of Classification Search
USPC .......................... 137/625.16, 628, 597, 884
See application file for complete search history.

(56) References Cited

U.S. PATENT DOCUMENTS

| | | | | |
|---|---|---|---|---|
| 1,857,279 | A | * | 5/1932 | Gullette ................. F16K 27/06 137/876 |
| 2,331,133 | A | * | 10/1943 | Nardone ................ F16K 27/06 137/494 |
| 2,391,126 | A | | 12/1945 | Carter |
| 2,491,429 | A | | 12/1949 | Thomas, Sr. |
| 2,500,239 | A | * | 3/1950 | Beyette ................ F16K 27/003 137/597 |
| 2,538,215 | A | | 1/1951 | Stack |
| 2,700,984 | A | | 2/1955 | Gleasman |
| 2,979,082 | A | | 4/1961 | Neves |
| 3,443,595 | A | | 5/1969 | Baldwin |
| 3,729,051 | A | * | 4/1973 | Mannion ................. F24F 11/06 137/486 |
| 4,345,622 | A | * | 8/1982 | Henningsson .......... F16K 11/00 137/597 |
| 5,469,880 | A | * | 11/1995 | Zimmerly ................ B67C 3/28 137/240 |
| 5,511,574 | A | | 4/1996 | Macke |
| 6,036,107 | A | * | 3/2000 | Aspen ................. A01M 7/0089 137/883 |
| 6,257,279 | B1 | | 7/2001 | Peltz |
| 6,484,800 | B2 | | 11/2002 | Carmody et al. |
| 6,543,483 | B2 | * | 4/2003 | Johnson ................ F16K 27/003 137/884 |
| 7,520,298 | B2 | | 4/2009 | George et al. |
| 7,828,016 | B2 | * | 11/2010 | Otsuki ................ F16K 11/0856 137/884 |
| 8,397,759 | B2 | | 3/2013 | Oikawa et al. |
| 8,434,515 | B2 | | 5/2013 | Nilssen |
| 8,459,302 | B2 | | 6/2013 | Pederson et al. |
| 8,490,569 | B2 | | 7/2013 | Shen |
| 8,603,220 | B2 | | 12/2013 | Rarig et al. |
| 2013/0075642 | A1 | | 3/2013 | Hervieux et al. |
| 2016/0097188 | A1 | | 4/2016 | Eckberg et al. |

FOREIGN PATENT DOCUMENTS

| | | |
|---|---|---|
| JP | 60179572 A | 9/1985 |
| JP | 60179572 U | 11/1985 |
| JP | 2003227181 A | 8/2003 |
| JP | 2003232057 A | 8/2003 |
| WO | 2006055945 A2 | 5/2006 |
| WO | 2006055945 A3 | 5/2006 |

OTHER PUBLICATIONS

Unknown, "Valves: Directional-Sectional SV Series 12-15 GPM", Hydraulic Catalog, Cylinder Services Incorporated, Copyright © 2014 Cylinder Services Inc. http://www.cylinderservices.net/catalog Last printed Oct. 3, 2014. 4 pages.

Unknown, "STA-RITE® Multi-Port Filter Valve Owner's Manual", Sta-Rite Pool/Spa Group, S532 (Rev. Jun. 24, 2005), © 2005, Sta-Rite Industries http://www.pentairpool.com/pdfs/Sta-RiteMultiPortFilterValveOM.pdf 8 pages.

List of IBM Patents or Patent Applications Treated as Related, Sep. 21, 2016. 2 pages.

* cited by examiner

CONFIGURABLE MODULAR SLEEVE VALVE

BACKGROUND

Aspects of present disclosure relate to modular sleeve valves, and more specifically, to configurable in-floor liquid plumbing systems.

Valves can be used to create a plumbing system where liquid is routed from a source or reservoir to one or more outputs. For example, a plurality of computers in a defined area, such as servers in a server room, could utilize a liquid cooling system where one or more of the servers require cooling liquid to draw heat away from the servers. However, design of the plumbing system can prove where the location of the one or more outputs can change. For example, if one or more servers are rearranged in a server room, some locations in the server room may not have access to the plumbing system.

SUMMARY

According to embodiments of the present disclosure, a modular sleeve valve apparatus can include a valve body including a first port on a first sidewall of the valve body and a second port on a second sidewall of the valve body. The apparatus can include a first valve core sleeved within the valve body. The first valve core can be a cylinder including a first aperture in a cylindrical sidewall of the first valve core and a second aperture in a top base-wall of the first valve core. The cylindrical sidewall can define a first space within the first valve core. The first valve core can be removable from the valve body and radially rotatable within the valve body.

The apparatus can include a second valve core sleeved within the valve body. The second valve core can be a cylinder including a third aperture in a cylindrical sidewall of the second valve core and a fourth aperture in a bottom base-wall of the second valve core. The cylindrical sidewall of the second valve core can define a second space within the second valve core. The second valve core can be removable from the valve body and radially rotatable within the valve body. The second valve core can be positioned stacked upon the first valve core to align the second aperture and the fourth aperture to create a combined space from the first and second spaces.

Embodiments of the present disclosure are directed towards a modular sleeve valve apparatus including a valve body including a first port on a first sidewall of the valve body and a second port on a second sidewall of the valve body. The apparatus can include a valve core sleeved within the valve body. The valve core can be a cylinder including a first aperture and a second aperture in a cylindrical sidewall of the valve core, the cylindrical sidewall defining a space within the valve core, the valve core removable from the valve body and radially rotatable within the valve body.

Embodiments of the present disclosure are directed towards a system of configurable plumbing. The system can include a planar surface including a first junction-hole, a second junction-hole, and a first trench in the planar surface connecting the first junction hole to the second junction hole. The system can include a first modular sleeve valve in the first junction hole and a second modular sleeve valve in the second junction hole.

The first and second modular sleeve valves can include a valve body including a first port on a first sidewall of the valve body and a second port on a second sidewall of the valve body. The apparatus can include a first valve core sleeved within the valve body. The first valve core can be a cylinder including a first aperture in a cylindrical sidewall of the first valve core and a second aperture in a top base-wall of the first valve core. The cylindrical sidewall can define a first space within the first valve core. The first valve core can be removable from the valve body and radially rotatable within the valve body.

The apparatus can include a second valve core sleeved within the valve body. The second valve core can be a cylinder including a third aperture in a cylindrical sidewall of the second valve core and a fourth aperture in a bottom base-wall of the second valve core. The cylindrical sidewall of the second valve core can define a second space within the second valve core. The second valve core can be removable from the valve body and radially rotatable within the valve body. The second valve core can be positioned stacked upon the first valve core to align the second aperture and the fourth aperture to create a combined space from the first and second spaces.

The system can include a first pipe positioned in the first trench and connecting the first port of the first modular sleeve valve to the first port of the second modular sleeve valve.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
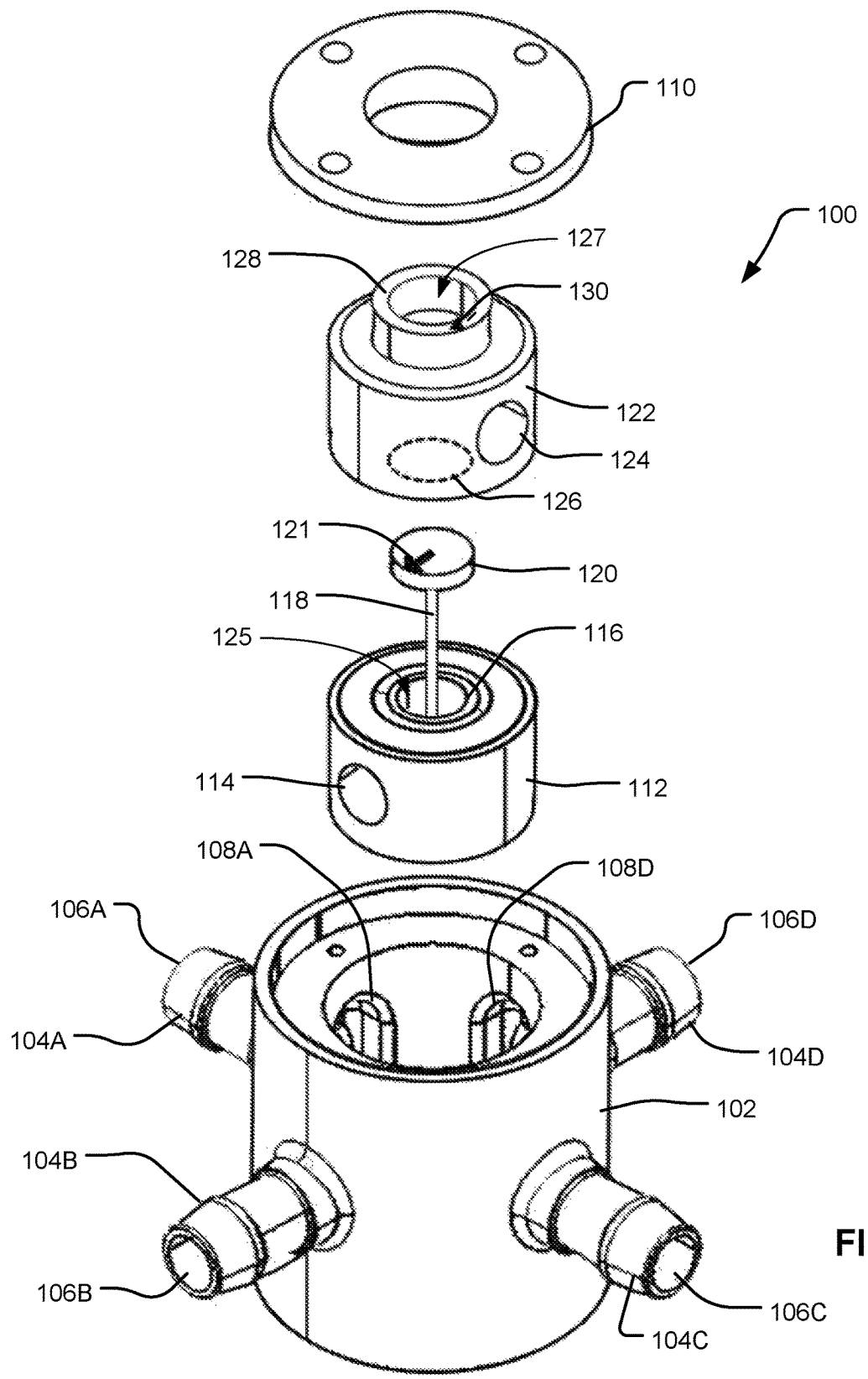
FIG. 1 depicts an exploded view of a modular sleeve valve according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to modular sleeve valves, more particular aspects relate to configurable routing using in-floor configurable modular sleeve valves. While the present disclosure is not necessarily limited to such applications, various aspects of the disclosure may be appreciated through a discussion of various examples using this context.

While the same nomenclature and same numbers may be used to identify elements throughout the disclosure, this practice is not intended to limit the scope of the disclosure. Identified elements in one figure may not be identical to other same named or identified elements in other figures.

Embodiments of the present disclosure are directed to a modular sleeve valve apparatus. The modular sleeve valve can include a valve body having a first port on a first sidewall of the valve body and a second port on a second sidewall of the valve body. The valve can include a first valve core sleeved within the valve body. The first valve core can be a cylinder including a first aperture in a cylindrical sidewall of the first valve core and a second aperture in a top base-wall of the first valve core. The cylindrical sidewall can define a first space within the first valve core and the first valve core can be removable from the valve body and radially rotatable within the valve body.

The valve can include a second valve core sleeved within the valve body. The second valve core can be a cylinder including a third aperture in a cylindrical sidewall of the second valve core and a fourth aperture in a bottom base-wall of the second valve core. The cylindrical sidewall of the second valve core can define a second space within the second valve core. The second valve core can be removable from the valve body and radially rotatable within the valve body. The second valve core can be positioned stacked upon the first valve core to align the second aperture and the fourth aperture to create a combined space from the first and second spaces.

Valves can be used to create a plumbing system where a plurality of valves are interconnected with a plurality of pipes to route fluid from a source to one or more outputs. For example, a plurality of computers in a defined area, such as servers in a server room, could utilize a liquid cooling system where one or more of the servers require cooling liquid to draw heat away from the servers.

A plumbing system in the server room could be designed to route cooling liquid from a source to the servers in the server room. However, in some instances, it can be difficult to reconfigure the plumbing system after being initially designed and installed. For example, the plumbing system could be designed to provide cooling liquid to a plurality of predetermined positions in the server room from a predetermined source. If at some point the servers are repositioned in the room, the plumbing system may not be able to provide liquid to new positions of the servers.

Embodiments of the present disclosure are directed to a system of configurable liquid plumbing. The system can include a planar surface including a first junction-hole, a second junction-hole, and a first trench in the planar surface connecting the first junction hole to the second junction hole. In embodiments, the system can be constructed within a planar surface to create an in-floor plumbing system. In embodiments, the planar surface can be a concrete floor, or other type of floor. The junction holes can be indents in the planar surface where valves can be placed. The trenches are indents in the planar surface where piping can be placed to connect valves in the junction holes. For example, the system could include a first configurable valve in a first junction hole and a second configurable valve in the second junction hole. The system could include and a trench connecting the first and second junction holes and a pipe in the trench connecting the first and second valves. In embodiments, the configurable valves can be a modular valve where modular components can be inserted and/or removed from the valve to configure the valves depending upon the requirements of the system.

Embodiments of the present disclosure are directed toward a modular sleeve valve. In embodiments, a modular sleeve valve can include a valve body including at least two ports on the valve body. In embodiments, the valve body is the outer casing of the modular sleeve valve that contains the components of the modular sleeve valve. For example, described further herein, the valve body can contain one or more valve cores which are configured to direct the flow of fluid through the modular sleeve valve. The valve body can be constructed as various shapes and sizes. For example, the valve body could be constructed as a cylinder. Ports could be positioned on a cylindrical sidewall of the valve body. In certain examples, the valve body could be constructed as a geometric prism, such as a cuboid or other prism. A first port could be positioned on a first sidewall of the valve body and a second port could be positioned on a second sidewall of the valve body. In embodiments, the ports are passages that allow fluid to pass through the valve body. For example, the first port could be used to intake fluid into the modular sleeve valve and the second port could be used to exhaust fluid from the modular sleeve valve.

In embodiments, the modular sleeve valve includes a valve core. In embodiments, a valve core is a movable obstruction inside the valve body that adjustably restricts flow of fluid through the modular sleeve valve. In embodiments, described further herein, the position of the valve core in the valve body can configure the direction of the fluid flow in the modular sleeve valve. For example, the valve core could be movable between a first position and a second position. In the first position, fluid could enter the modular sleeve valve at a first port and exit the modular sleeve valve at a second port. In the second position, passage through the modular sleeve valve could be blocked so that the modular sleeve valve is closed.

In embodiments, the valve cores are modular and can be removed and/or added to the valve body. For example, a first valve core could be removed from the valve body and replaced with a second and third valve core positioned in the valve body. Described further herein, the valve cores can be constructed as various designs so that the function, routing capabilities and other features of the modular sleeve valve can be configured by a user.

Referring now to FIG. 1, an exploded view of a modular sleeve valve 100 can be seen according to embodiments of the present disclosure. The modular sleeve valve 100 can include a valve body 102 having a plurality of ports 104A-104D including a first port 104A, a second port 104B, a third port 104C, and a fourth port 104D. The modular sleeve valve 100 can include a first valve core 112 having a first aperture 114 and a second aperture 116, and a second valve core 122 having a third aperture 124 and fourth aperture 126.

The valve body 102 can be the exterior structure of the modular sleeve valve 102. The valve body can contain the various components of the modular sleeve valve 100. For example, the valve body can contain one or more valve cores described further herein.

The valve body 102 can include ports 104A-104D. The ports 104A-104D can provide access for fluid to enter and/or exit the modular sleeve valve 100. For example, each port 104A-104D can serve as an intake port where fluid enters the modular sleeve valve, or as an exhaust port were fluid exits the modular sleeve valve. In embodiments, the valve body 102 can include at least two ports 104A-104D. For example, in FIG. 1, the valve body 102 can include a first port 104A, a second port 104B, a third port 104C, and a fourth part 104D. For example, the first port 104A could intake fluid into the modular sleeve valve 100. Described further herein, the modular sleeve valve 100 could be configured to exhaust the fluid to the third port 104C. In certain embodiments, any of the ports could be used as intakes or exhausts depending upon the configuration of the modular sleeve valve 100.

The ports 104A-104D can be positioned on one or more sidewalls of the valve body 102. For example, where the valve body 102 is a cuboid having at least four sidewalls, each of the ports 104A-104D could be positioned on a sidewall. Thus, the first port 104A could be positioned on a first sidewall, the second port 104B could be positioned on a second sidewall, the third port 104C could be positioned on a third sidewall, and the fourth port 104D could be positioned on a fourth sidewall. In embodiments, the valve body 102 can be a cylinder having a cylindrical sidewall, as seen in FIG. 1. The ports 104A-104D can be positioned on the cylindrical sidewall of the valve body 102.

Each of the ports 104A-104D can include exterior openings 106A-106D and interior openings 108A-108D. The exterior openings 106A-106D can be positioned on the sidewall of the valve body 102. The interior openings can be positioned within the valve body, adjacent to the first and second valve cores. In embodiments, the interior openings 108A-108D are widened, relative to the exterior opening 106A-106D. For example, the interior opening 108A-108D could be widened to be at least twice as large as the exterior opening 106A-106D. In embodiments, the interior openings 108A-108D can be widened to align with the first aperture 114 and the third aperture 124 of the first and second valve cores 112, 122 such that liquid entering/exiting the modular sleeve valve 100 can be directed to the first and third apertures 114, 124.

The valve body 102 can include a cap base-wall 110. The cap base-wall 110 can be a removable portion of the valve 102 which allows components to be changed within the modular sleeve valve 100. For example, described further herein, the first and second valve cores 112, 122 can be removable from the valve body and replaced with other types of valve cores. In embodiments, the cap base-wall 110 can secure the first and second valve cores 112, 122 in the valve body 102 when attached to the valve body 102. Thus, when the cap base-wall 110 is removed, the first and second valve cores 112, 122 can be removed from the valve body. In embodiments, the cap base-wall 110 can be secured to the valve body 102 via clamps, screws, latches, or other suitable types of fasteners.

The first and second valve cores 112, 122 are valve cores which can be configured to direct the flow of fluid within the modular sleeve valve 100. The first and second valve cores can be cylinders which are inserted and sleeved within the valve body 102.

The first valve core 112 can include a first aperture 114 in a cylindrical sidewall of the first valve core 112 and a second aperture 116 in a top base-wall of the first valve core. The cylindrical sidewall can define a first space within the first valve core 112.

The second valve core 122 can include a third aperture 124 in a cylindrical sidewall of the second valve core 122 and a fourth aperture 126 in a bottom base-wall of the second valve core 122. The cylindrical sidewall of the second valve core 122 can define a second space within the second valve core 122. The second valve core 122 can be positioned stacked upon the first valve core 112 to align the second aperture 116 and the fourth aperture 126 to create a combined space from the first and second spaces. Described further herein, fluid can be directed within the modular sleeve valve by the first and second valve cores 112, 122 by flowing through the first aperture 114, the combined space, and third aperture 124.

In embodiments, the first and second valve cores 112, 122 are independently radially rotatable within the valve body 102. For example, the first and second valve cores 112, 122 could be independently radially rotatable between a first position, a second position, a third position, and a fourth position.

In embodiments, when the first valve core 112 is in the first position the first aperture 114 is aligned with the first port 104A. In embodiments, when the second valve core 112 is in the first position, the third aperture 124 is aligned with the first port 104A. In embodiments, when the first valve core 112 is in the second position, the first aperture is aligned with the second port 104B. In embodiments, when the second valve core 122 is in the second position, the third aperture 124 is aligned with the second port 104B. In embodiments, when the first valve core 112 is in the third position, the first aperture 114 is aligned with the third port 104C. In embodiments, when the second valve core 122 is in the third position, the third aperture 124 is aligned with the third port 104C. In embodiments, when the first valve core 112 is in the fourth position, the first aperture 114 is aligned with the fourth port 104D. In embodiments, when the second valve core 122 is in the fourth position, the third aperture 124 is aligned with the fourth port 104D.

As seen in FIG. 1, the first valve core 112 is in the second position with the first aperture 114 aligned with the second port 104B. The second valve core 122 is in the third position with the third aperture 124 aligned with the third port 104C.

When the first and second valve cores 112, 122 are aligned with a port 104A-104D, the combined space can be accessed through the aligned ports and through the first and third apertures 114, 124. For example, when the first valve core 112 is in the second position, the first aperture 114 can be aligned with the second port 104B allowing access from the second port 104B to the combined space. When the second valve core 122 is in the third position, the third aperture 124 can be aligned with the third port 104C, allowing access from the third port 104C to the combined space. Thus, liquid could flow through the modular sleeve valve 100 by entering the third port 104C entering the combined space, and exiting through the second port 104B.

In embodiments, the first valve core 112 includes a first handle 120 and a stem 118. The stem 118 has a first end connected to a bottom base-wall of the first valve core 112 and a second end extended through the combined space to at least a top base-wall of the second valve core 122. The first handle 120 can be connected to the second end. In embodiments the first handle can be configured to radially rotate the first valve core 112 in the valve body 102 between various positions, as described herein. In embodiments, the second valve core 122 includes a second handle 128 positioned on the top base-wall of the second valve core 122. In embodiments, the second handle 128 can be configured to radially rotate the second valve core 122 in the valve body 102 between various positions, as described herein.

In embodiments, the first handle 120 includes a first visual indicator 121. The first visual indictor 121 can be aligned with the first aperture 114 to indicate a radial position of the first aperture 114 in the valve body 102. In embodiments, the second valve core 122 can include a second visual indicator 130 positioned on the second handle 128. The second visual indicator 130 can be aligned with the third aperture 124 to indicate the radial position of the third aperture 124 in the valve body 102.

Figure 2:
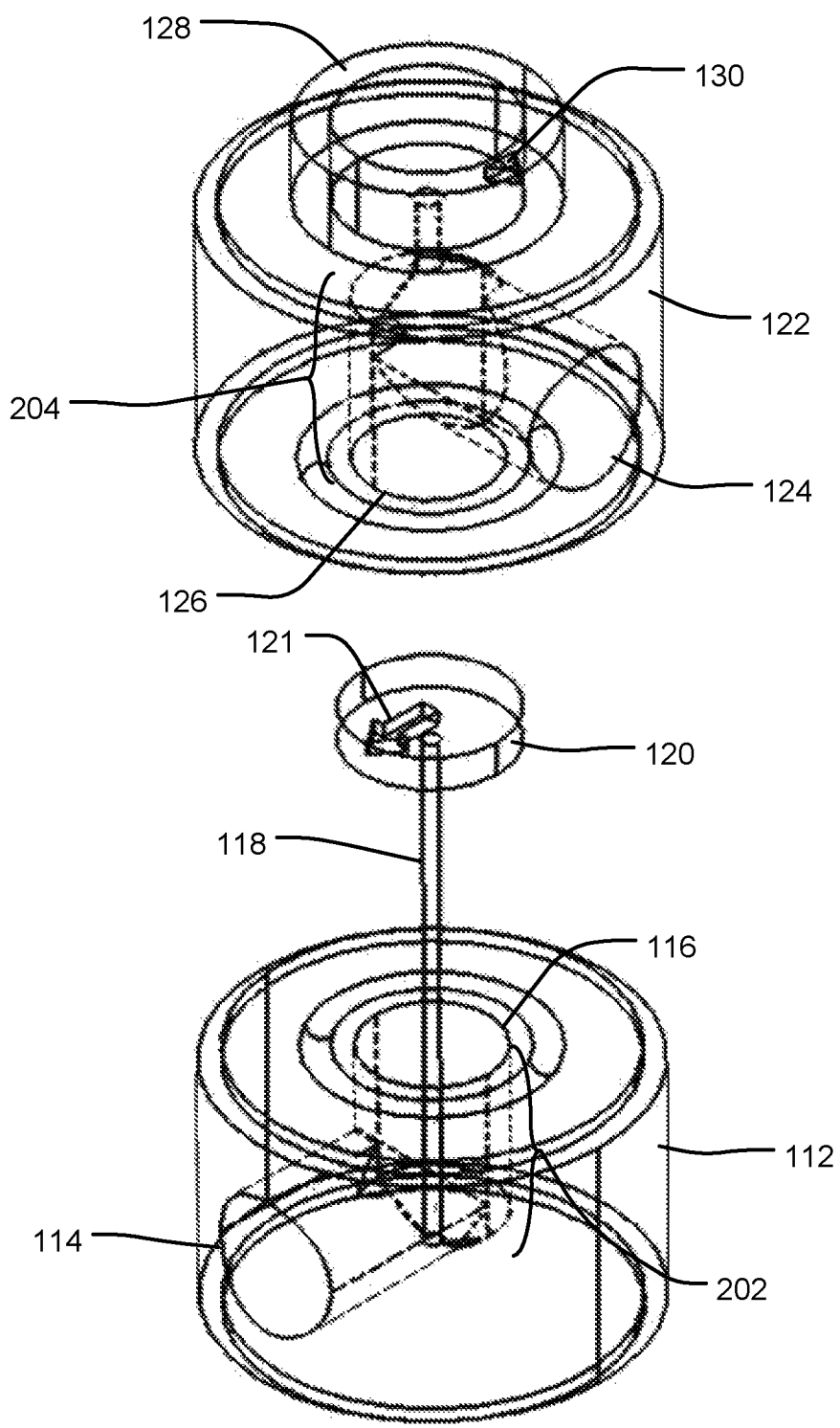
FIG. 2 depicts a cross section of first and second valve cores according to embodiments of the present disclosure.

Referring now to FIG. 2, a cross section of the first and second valve cores 112, 122, can be seen according to embodiments of the present disclosure. As described herein, the first valve core 112 can include a first aperture 114 in a cylindrical sidewall of the first valve core 112 and a second aperture 116 in a top base-wall of the first valve core 112. The cylindrical sidewall of the first valve core 112 can define a first space 202 within the first valve core 112. The first aperture 114 and the second aperture 116 allow access to the first space 202 within the first valve core 112.

As described herein, the second valve core 122 can include a third aperture 124 in a cylindrical sidewall of the second valve core 122 and a fourth aperture 126 in a bottom base-wall of the second valve core 122. The cylindrical sidewall of the second valve core 122 can define a second space 204 within the second valve core 122. The third aperture 124 and the fourth aperture 126 allow access to the second space 204 within the second valve core 122.

In embodiments, the first valve core 112 and the second valve core 122 could include a plurality of apertures in the cylindrical sidewalls. For example, the first valve core 112 could include at least two apertures in the cylindrical sidewall so that fluid could enter or exit the modular sleeve valve through two or more ports 104A-104D (FIG. 1).

In embodiments, the first and second valve cores 112, 122 are stacked together in a valve body 102 (FIG. 1), as described herein. The second valve core 122 can be stacked upon the first valve core such that the second aperture 116 and the fourth aperture 126 are aligned. When the first and second valve cores are stacked, a combined space can be formed from the first space and the second space through the second and fourth apertures 116, 126. In embodiments, the first and second valve cores 112, 122 can include a gasket and/or spacer to seal the alignment of the second aperture 116 and the fourth aperture 126. The gasket and/or spacer can reduce leakage of liquid between the first and second valve cores 112, 122 and improve flow of liquid through the modular sleeve valve 100 (FIG. 1).

The first valve core 112 includes a first handle 120 and a stem 118. The stem 118 has a first end connected to a bottom base-wall of the first valve core 112 and a second end extended through the combined space of the first and second spaces 202, 204 to at least a top base-wall of the second valve core 122. In embodiments, the stem 118 has a diameter smaller than the diameter of the second aperture 116 and fourth aperture 126 such that the stem 118 can pass through the first and second valve cores 112, 122. The first handle 120 is connected to the second end of the stem 118. As described herein, the first handle 120 can be configured to radially rotate the first valve core 112 in the valve body 102. In embodiments, the second valve core 122 includes a second handle 128 positioned on the top base-wall of the second valve core 122. In embodiments, the second handle 128 can be configured to radially rotate the second valve core 122 in the valve body 102 between various positions, as described herein.

Figure 3:
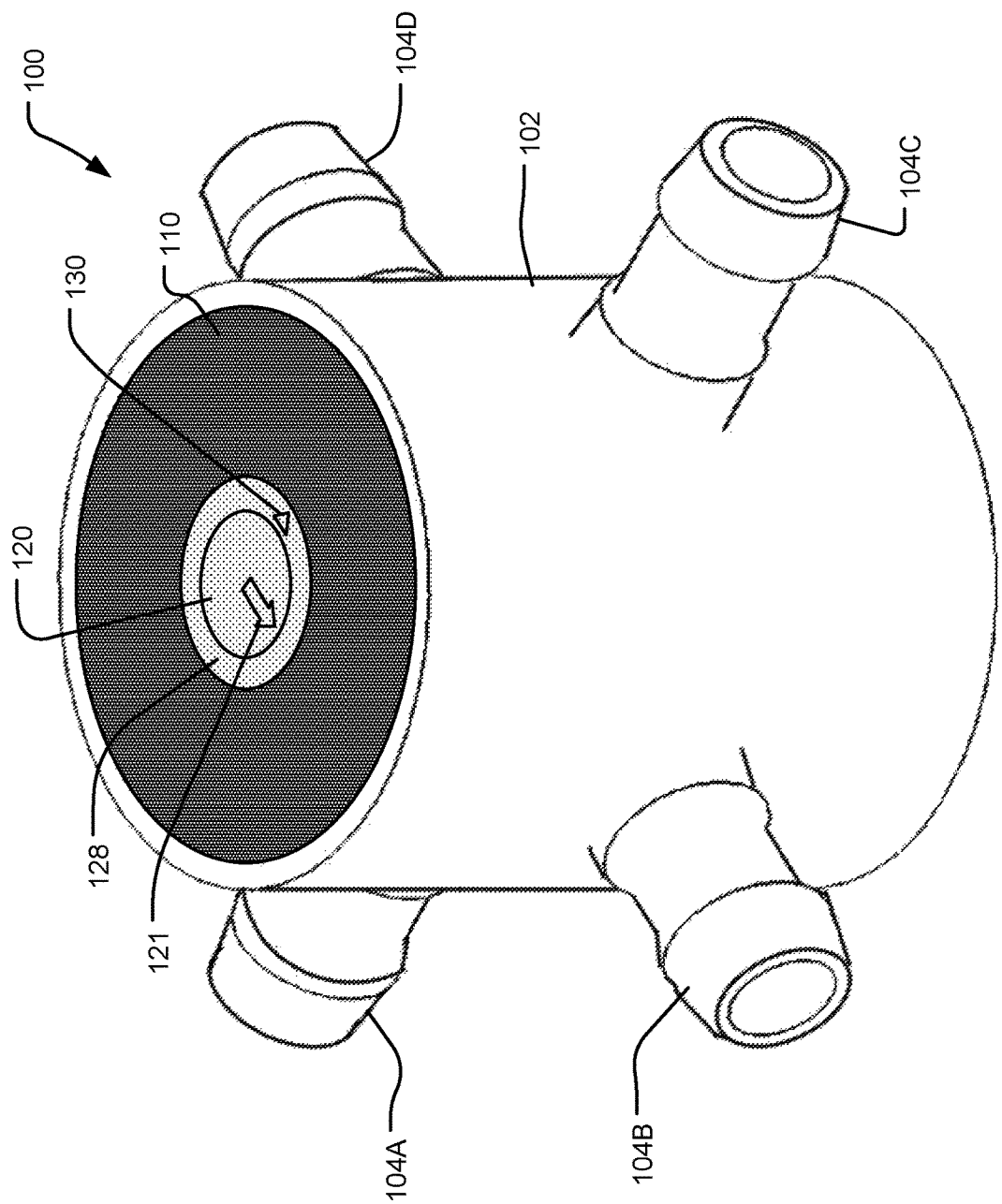
FIG. 3 depicts a constructed view of a modular sleeve valve according to embodiments of the present disclosure.

Referring now to FIG. 3, a constructed view of a modular sleeve valve 100 can be seen according to embodiments of the present disclosure. As described herein, the modular sleeve valve 100 can include a valve body 102 having ports 104A-104D. In embodiments, the ports 104A-104D can include a first port 104A, a second port 104B, a third port 104C, and a fourth port 104D. The valve body 102 can include a cap sidewall 110. As seen in FIG. 3, the cap sidewall 110 can be secured to the valve body 102.

In embodiments, the first handle 120 and second handle 128 extend through an aperture in the cap sidewall 110. As described herein, the first handle 120 can include a first indicator 121 which indicates the radial position of the first aperture 114 (FIG. 1) in the valve body 102. The second handle 128 can include a second indicator 130 which indicates the radial position of the third aperture 124 (FIG. 1) in the valve body 102.

Figure 4:
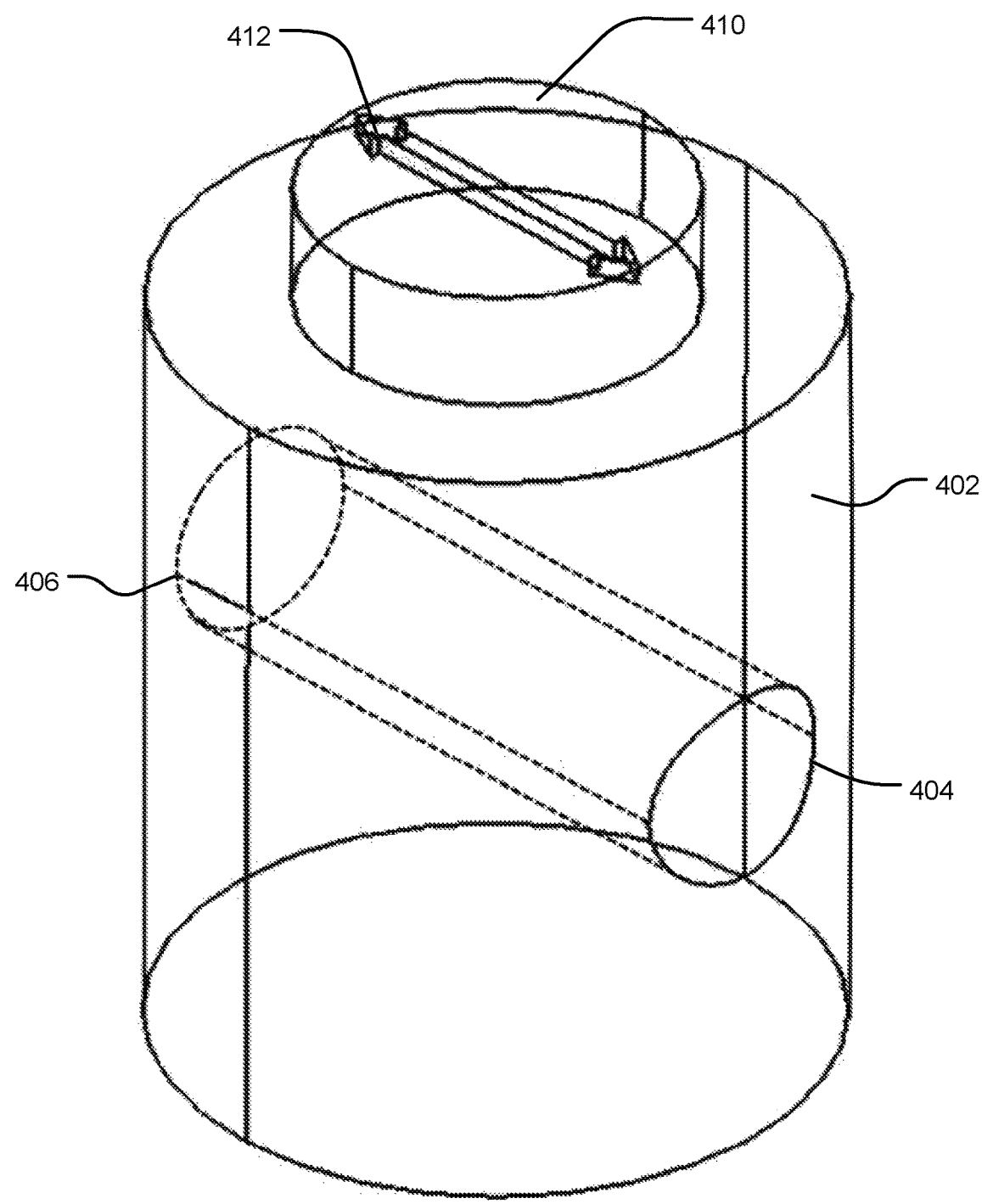
FIG. 4 depicts a cross section view of a valve core according to embodiments of the present disclosure.

Referring now to FIG. 4, a cross section view of a valve core 402 can be seen according to embodiments of the present disclosure. The valve core 402 can include a first aperture 404 and a second aperture 406 in a cylindrical sidewall of the valve core 402. The cylindrical sidewall can define a space within the valve core which allows fluid to pass through the valve core 402, as described herein. As described herein, the valve core 402 can be sleeved within the valve body and radially rotatable between various positions in a valve body.

For example, the valve core 402 could be radially rotatable between at least first position and a second position in a valve body. When the valve core 402 is in the first position, the first aperture 404 could aligned with a first port and the second aperture 406 could be aligned with a second port, allowing access from the first port and second port to the space. When the valve core is in the second position, the first aperture 404 could be unaligned with the first port and the second aperture 406 could be unaligned with the second port.

Figure 5:
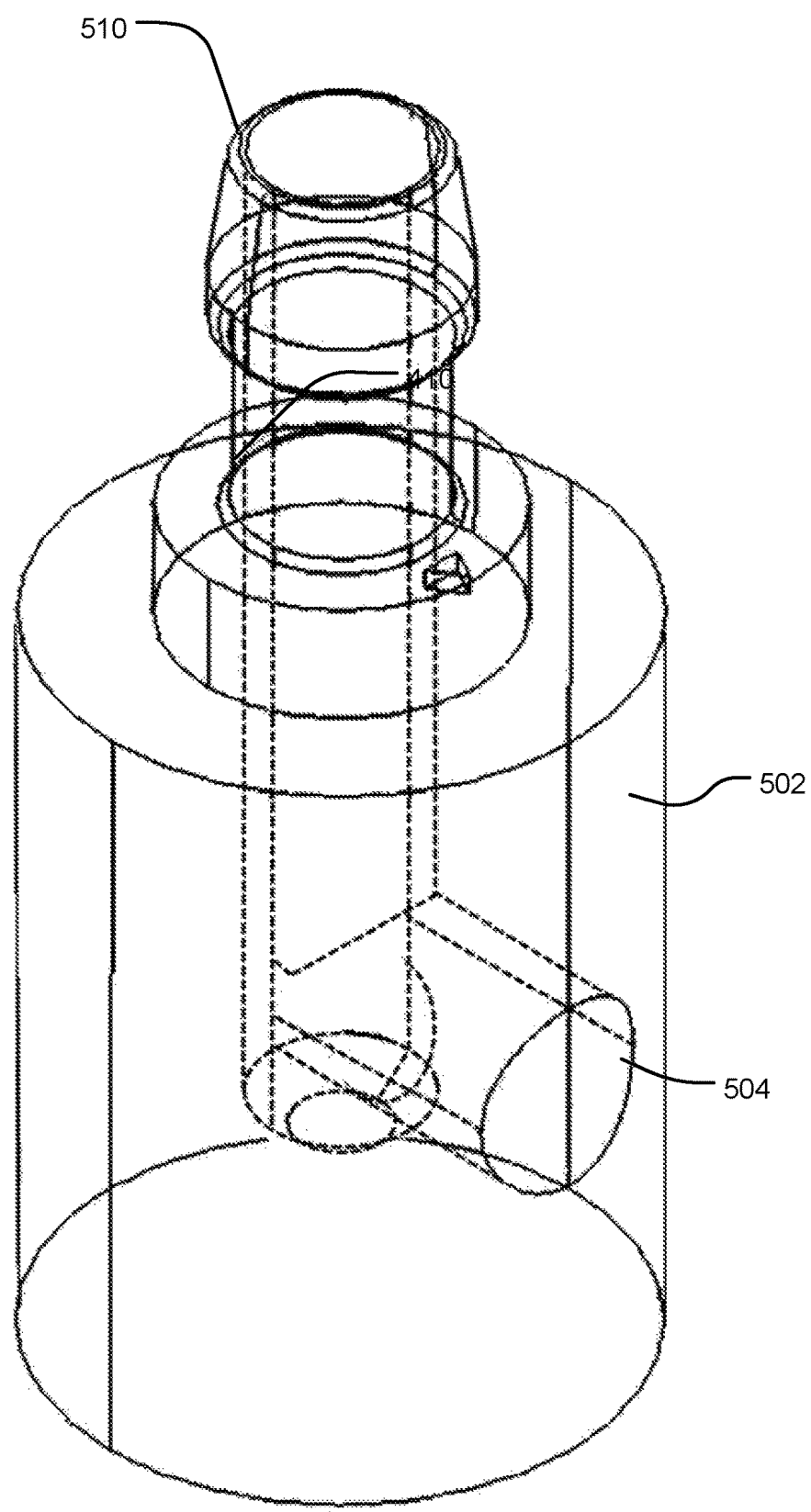
FIG. 5 depicts a cross section view of a valve core according to embodiments of the present disclosure.

Referring now to FIG. 5, a cross section view of a valve core 502 can be seen according to embodiments of the present disclosure. The valve core 502 can include a first aperture 504 in a cylindrical sidewall of the valve core 502. The cylindrical sidewall can define a space within the valve core 502 which allows fluid to move through the valve core 502.

As described herein, the valve core 502 can be sleeved within a valve body and radially rotatable between various positions in the valve body. The valve core 502 can include a top port 510 on a top base-wall of the valve core 502. The top port 510 can allow access to the space. In embodiments, the top port 510 can be used in lieu of a port on the valve body, as described herein. For example, the valve core 502 could be used to connect to a reservoir so that liquid can be entered into a plumbing system, described further below.

Figure 6:
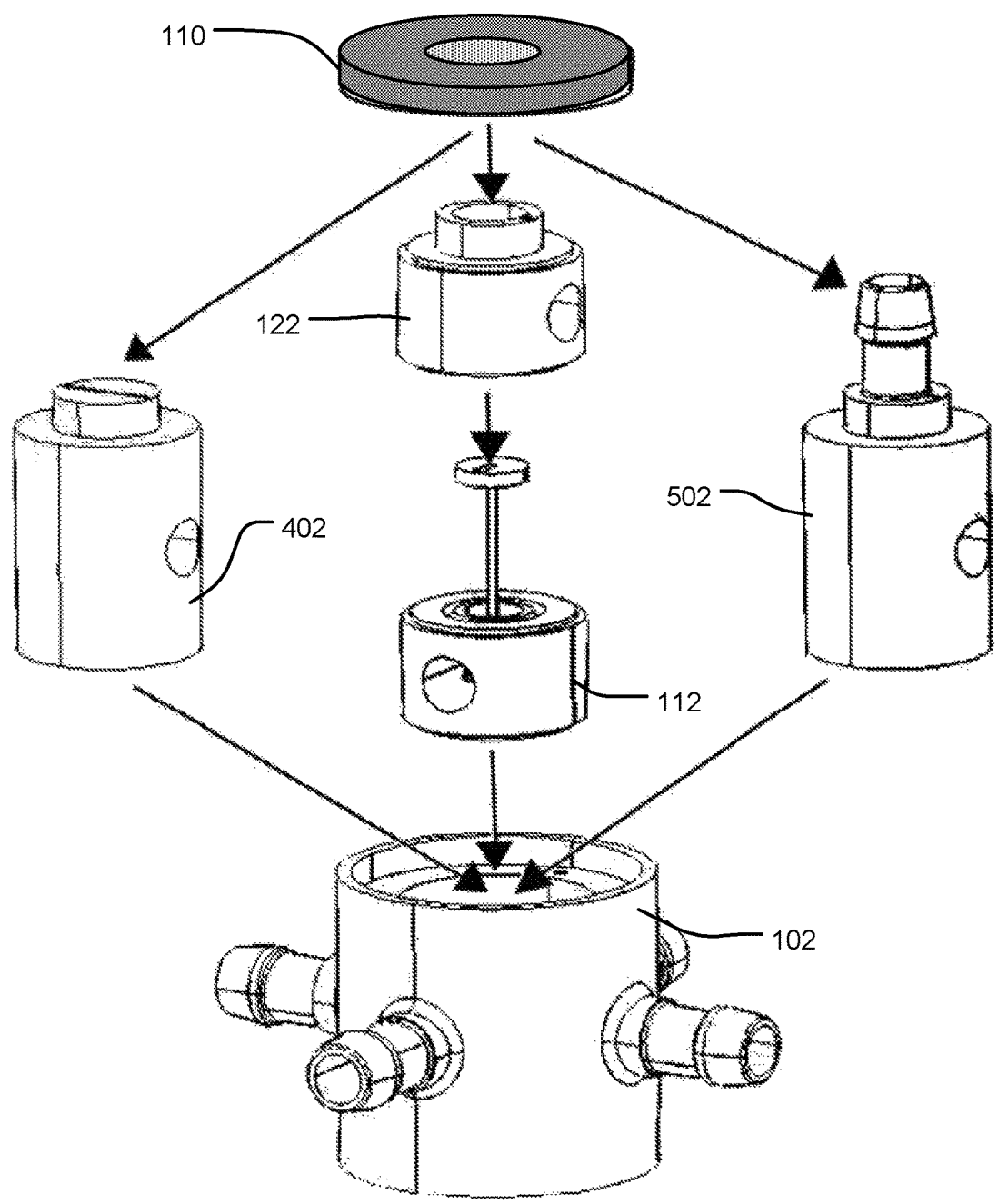
FIG. 6 depicts a deconstructed modular sleeve valve with various valve cores according to embodiments of the present disclosure.

Referring now to FIG. 6, an exploded view of a modular valve core can be seen with various usable valve cores, according to embodiments of the present disclosure. The various valve cores include a first and second valve core 112 122 as described herein. The valve cores also include valve core 402 and valve core 502 as described herein. FIG. 6 depicts how the various valve cores 112, 122, 402, 502 can be replace one another in a valve body 102 to create the modular sleeve valve according to embodiments of the present disclosure. For example, as described herein, valve cores 112, 122 could be inserted sleeved within the valve body 102 stacked upon one another. In certain examples, valve core 402 could be inserted sleeved within the valve body 102. In certain examples, valve core 502 could be inserted, sleeved within the valve body 102. Each of the valve cores 112, 122, 402, 502 can be secured within the valve body 102 via a cap base-wall 110, as described herein.

Figure 7:
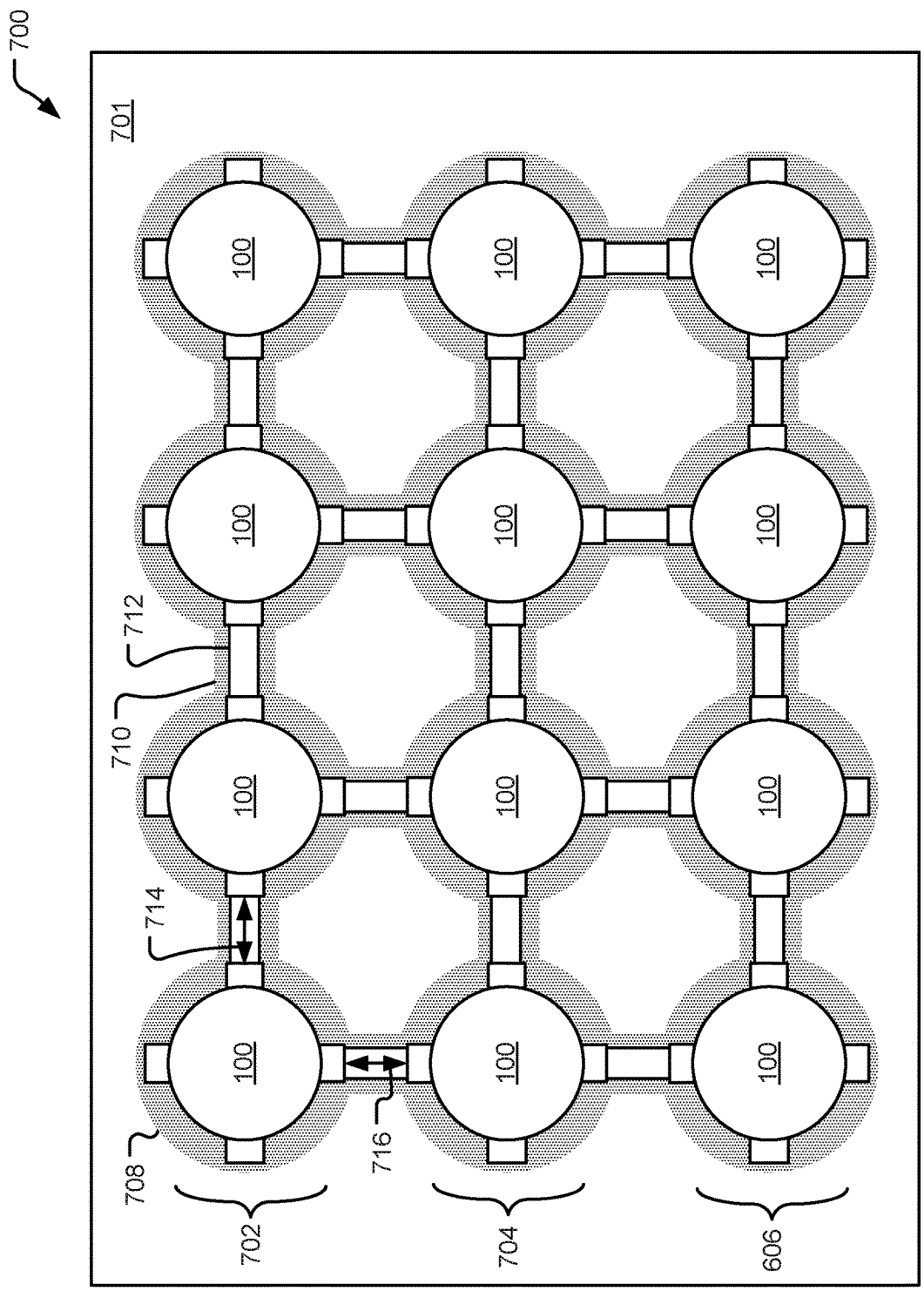
FIG. 7 depicts a top view of a system of configurable liquid plumbing according to embodiments of the present disclosure.

Referring now to FIG. 7, a top view of a system 700 of configurable liquid plumbing can be seen according to embodiments of the present disclosure. The system 700 can include a planar surface 701 including a plurality of junction holes 714 and trenches 710. The planar surface 701 can be the same or substantially similar as described herein.

The system 700 can include a first row 702 of a plurality of junction holes 708. The junction holes 708 can be the same or substantially similar as described herein. Each of the junction holes 708 in the first row 702 can be separated from one another by a row distance 714. The row distance 714 can be selected as various distances depending upon the requirements of the system 700 and the preferences of a user. In embodiments, the row distance is selected as six hundred millimeters. Similarly, in embodiments, each of the junction holes 708 in the second row 704 and each of the junction holes 708 in the third row 706 can be separated from one another by the row distance 714. A plurality of trenches 710 can connect each of the junction holes 708 in the first, second, and third rows 702, 704, and 706.

Each of the rows can be separated from adjacent rows by a column distance 716. For example the first row 702 and second row 704 can be separated by the column distance 716, and the second row 704 and the third row 706 can be separated by the column distance 716. The row distance 714 can be selected as various distances depending upon the requirements of the system 700 and the preferences of a user. In embodiments, the row distance 714 is selected as six hundred millimeters. A plurality of trenches 710 can connect each of the junction holes 708 in the first, second, and third rows 702, 704, 706. Thus, the system 700 can have a plurality of junction holes 708 and a plurality of trenches 710 which form a grid pattern as seen in FIG. 6.

A plurality of modular sleeve valves 100 can be placed the plurality of junction holes 708. The plurality of modular sleeve valves 100 can have various different types of valve cores 112, 122, 402, 502 (FIG. 6) inserted, as described herein. For example a first and second modular sleeve valve could include valve core 502 (FIG. 6). The first modular sleeve valve could serve as an intake modular valve core for the system 700 with the top port 510 attached to a reservoir. The second modular sleeve valve could serve as an exit for the system 700 which the top port 510 attached to a computer cooling system. In embodiments, maintenance or valve disassembly and re-configuration can be completed by using surrounding valves in the grid to turn off the flow to the valve being re-configured which can allow near-normal fluid flow through the system 700. For example, the plurality of modular sleeve valves 100 could be configured to isolate a first modular sleeve valve within the system 700.

The modular sleeve valves 100 can be the same or substantially similar as described herein. A plurality of pipes 712 can be placed in the plurality of trenches, the plurality of pipes connecting ports of the plurality of modular sleeve valves 100.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system of configurable fluid plumbing, the system comprising:
   a planar surface including a first junction-hole, a second junction-hole, and a first trench in the planar surface connecting the first junction hole to the second junction hole;
   a first modular sleeve valve in the first junction hole; and
   a second modular sleeve valve in the second junction hole, the first and second modular sleeve valves including:
      a valve body including a first port on a first sidewall of the valve body and a second port on a second sidewall of the valve body;
      a first valve core sleeved within the valve body, the first valve core a cylinder including a first aperture in a cylindrical sidewall of the first valve core and a second aperture in a top base-wall of the first valve core, the cylindrical sidewall defining a first space within the first valve core, the first valve core removable from the valve body and radially rotatable within the valve body; and
      a second valve core sleeved within the valve body, the second valve core a cylinder including a third aperture in a cylindrical sidewall of the second valve core and a fourth aperture in a bottom base-wall of the second valve core, the cylindrical sidewall of the second valve core defining a second space within the second valve core, the second valve core removable from the valve body and radially rotatable within the valve body, the second valve core positioned stacked upon the first valve core to align the second aperture and the fourth aperture to create a combined space from the first and second spaces; and
   a first pipe positioned in the first trench and connecting the first port of the first modular sleeve valve to the first port of the second modular sleeve valve.

2. The system of claim 1, wherein:
   the planar surface further includes:
      a first row and a second row of a plurality of junction holes, each of the junction holes in the first row separated from one another by a row distance and each of the junction holes in the second row separated from one another by the row distance, and the first row and second row separated by a column distance; and
      a plurality of trenches connecting the plurality of junction holes to form a grid pattern;
   wherein the plurality of junction holes includes first junction hole and the second junction hole.

3. The system of claim 2, further comprising:
   a plurality of modular sleeve valves placed the plurality of junction holes, the plurality of modular sleeve valves including the first and second modular sleeve valves; and
   a plurality of pipes placed in the plurality of trenches, the plurality of pipes connecting the first and second ports of the plurality of modular sleeve valves in the grid pattern, the plurality of pipes including the first pipe.

4. The system of claim 3, wherein the plurality of modular sleeve valves are configured to:
   isolate the first modular from other modular sleeve valves of the plurality of sleeve valves in the system.

5. The system of claim 2, wherein:
   the row distance is approximately 600 millimeters; and
   the column distance is approximately 600 millimeters.

6. The system of claim 1, further comprising:
   a reservoir connected to the second port of the first modular sleeve valve a computer cooling system connected to the second port of the second modular sleeve valve.

* * * * *